(12) United States Patent
Gu et al.

(10) Patent No.: US 10,963,191 B1
(45) Date of Patent: Mar. 30, 2021

(54) 3D NAND FLASH MEMORY DEVICE AND INTEGRATION METHOD THEREOF

(71) Applicant: Yangtze Memory Technologies Co., Ltd., Wuhan (CN)

(72) Inventors: Yi Gu, Wuhan (CN); Chunyuan Hou, Wuhan (CN); Yueping Li, Wuhan (CN); Jiawei Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/903,393

(22) Filed: Jun. 17, 2020

Related U.S. Application Data

(63) Continuation of application No. PCT/CN2020/091137, filed on May 20, 2020.

(51) Int. Cl.
| | |
|---|---|
| *G11C 16/26* | (2006.01) |
| *G06F 3/06* | (2006.01) |
| *H01L 27/11573* | (2017.01) |
| *G11C 16/10* | (2006.01) |
| *G11C 11/56* | (2006.01) |
| *H01L 27/11519* | (2017.01) |
| *H01L 27/11524* | (2017.01) |
| *H01L 27/11529* | (2017.01) |
| *H01L 27/11551* | (2017.01) |

(Continued)

(52) U.S. Cl.
CPC .......... *G06F 3/0688* (2013.01); *G06F 3/0608* (2013.01); *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01); *H01L 27/1157* (2013.01); *H01L 27/11519* (2013.01); *H01L 27/11524* (2013.01); *H01L 27/11529* (2013.01); *H01L 27/11551* (2013.01); *H01L 27/11565* (2013.01); *H01L 27/11573* (2013.01); *H01L 27/11578* (2013.01)

(58) Field of Classification Search
CPC ................. G06F 3/0688; G06F 3/0608; H01L 27/11524; H01L 27/11573; H01L 27/11519; H01L 27/11565; H01L 27/11551; H01L 27/1157; H01L 27/11529; H01L 27/11578; G11C 11/5628; G11C 11/5671; G11C 16/0483; G11C 16/10; G11C 1/5642; G11C 16/26
USPC ............................................. 365/244, 230.06
See application file for complete search history.

(56) References Cited

U.S. PATENT DOCUMENTS

| 8,008,970 B1 * | 8/2011 | Homol .................. H03F 1/0261 330/51 |
| 2001/0015905 A1 | 8/2001 | Kim |

(Continued)

FOREIGN PATENT DOCUMENTS

| CN | 102177549 A | 9/2011 |
| CN | 102544022 A | 7/2012 |

*Primary Examiner* — Michael T Tran
(74) *Attorney, Agent, or Firm* — Winston Hsu

(57) ABSTRACT

An integration method for a 3D NAND flash memory device includes disposing a plurality of 3D triple-level cell (TLC) NAND flash memories on a CMOS die; disposing at least a NOR Flash memory on the CMOS die of the 3D NAND flash memory device; and connecting the at least a NOR Flash memory to an Open NAND Flash Interface (ONFI) of the 3D NAND flash memory device; wherein the at least a NOR Flash memory is disposed on an unused area of the CMOS die.

14 Claims, 2 Drawing Sheets

(51) Int. Cl.
*H01L 27/11565* (2017.01)
*H01L 27/1157* (2017.01)
*H01L 27/11578* (2017.01)
*G11C 16/04* (2006.01)

(56) References Cited

U.S. PATENT DOCUMENTS

| | | |
|---|---|---|
| 2006/0250847 A1 | 11/2006 | Campardo |
| 2010/0027314 A1* | 2/2010 | Chevallier ............... G11C 11/16 365/148 |
| 2016/0159638 A1* | 6/2016 | Chen ..................... B81B 3/0086 257/417 |
| 2018/0197586 A1* | 7/2018 | Nguyen ................... G11C 5/06 |
| 2019/0043836 A1* | 2/2019 | Fastow ............... H01L 25/0657 |
| 2019/0043874 A1* | 2/2019 | Thimmegowda ... H01L 23/5226 |
| 2019/0121560 A1* | 4/2019 | Keeth ................ G06F 11/1004 |
| 2019/0121929 A1* | 4/2019 | Chen ....................... G06F 30/39 |
| 2019/0164581 A1* | 5/2019 | Nguyen ................. G11C 7/067 |
| 2019/0227749 A1* | 7/2019 | Wakchaure ........... G06F 3/0688 |
| 2019/0287583 A1* | 9/2019 | Hollis ................. G06F 13/1668 |
| 2019/0341370 A1* | 11/2019 | Keeth ..................... H01L 24/24 |
| 2020/0083888 A1* | 3/2020 | Lupino ................. H01L 27/283 |
| 2020/0167274 A1* | 5/2020 | Bahirat .................. G06F 3/0659 |
| 2020/0211640 A1* | 7/2020 | Sharon .................. G06F 9/3004 |
| 2020/0365210 A1* | 11/2020 | Chibvongodze ............................ H01L 27/11519 |

* cited by examiner

3D NAND FLASH MEMORY DEVICE AND INTEGRATION METHOD THEREOF

CROSS REFERENCE TO RELATED APPLICATIONS

This is a continuation application of International Application No. PCT/CN2020/091137 filed on May 20, 2020, which is incorporated herein by reference.

BACKGROUND OF THE INVENTION

1. Field of the Invention

The present invention relates to a 3D NAND flash memory device and integration method thereof, and more particularly, to 3D NAND flash memory device and integration method thereof capable of improving storage space and read/write performance.

2. Description of the Prior Art

In order to provide better performance for solid-state disk (SSD), a combinational structure of single-level cell (SLC) NAND flash memory and 3D triple-level cell (TLC) NAND flash memory is widely utilized in conventional SSD implementations. Hot data, which are often read/write, are stored in the SLC NAND flash; cold data, which are not often read/write, are stored in the 3D TLC NAND flash. However, the 3D TLC NAND flash memory utilized by the above combinational structure reduces a storage density and increases cost of the SSD. In addition, read/write performance of the SLC NAND of the combinational structure is not satisfying. Therefore, improvements are necessary to the prior arts.

SUMMARY OF THE INVENTION

The present invention provides a 3D NAND flash memory device and integration method thereof to improve storage space and read/write performance.

An embodiment of the present invention discloses an integration method for a 3D NAND flash memory device, comprises disposing a plurality of 3D triple-level cell (TLC) NAND flash memories on a CMOS die; disposing at least a NOR Flash memory on the CMOS die of the 3D NAND flash memory device; and connecting the at least a NOR Flash memory to an Open NAND Flash Interface (ONFI) of the 3D NAND flash memory device; wherein the at least a NOR Flash memory is disposed on an unused area of the CMOS die.

Another embodiment of the present invention discloses a 3D NAND flash memory device, integrated on a CMOS die, comprises a plurality of 3D triple-level cell (TLC) NAND flash memories, disposed on the CMOS die; and at least a NOR Flash memory, disposed on the CMOS die and the at least a NOR Flash memory is connected to an Open NAND Flash Interface (ONFI) of the 3D NAND flash memory; wherein the at least a NOR Flash memory is disposed on an unused area of the CMOS die.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
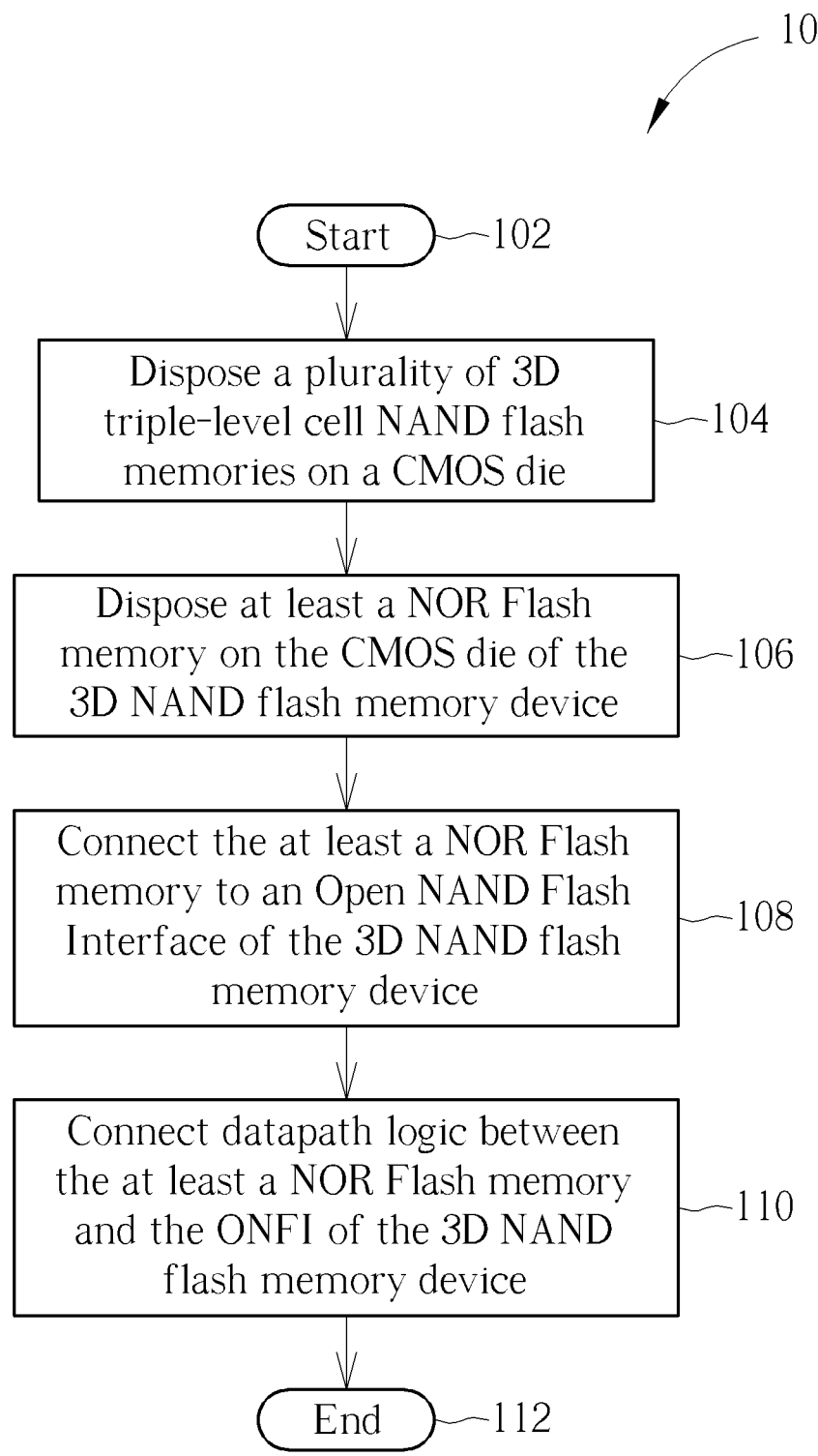
FIG. 1 is a schematic diagram of an integration process for a 3D NAND flash memory device according to an embodiment of the present invention.

FIG. 1 is a schematic diagram of an integration process 10 for a 3D NAND flash memory device according to an embodiment of the present invention. The integration process 10 for the 3D NAND flash memory device includes the following steps:

Step 102: Start.
Step 104: Dispose a plurality of 3D triple-level cell (TLC) NAND flash memories on a CMOS die.
Step 106: Dispose at least a NOR Flash memory on the CMOS die of the 3D NAND flash memory device.
Step 108: Connect the at least a NOR Flash memory to an Open NAND Flash Interface (ONFI) of the 3D NAND flash memory device.
Step 110: Connect datapath logic between the at least a NOR Flash memory and the ONFI of the 3D NAND flash memory device.
Step 112: End.

Figure 2:
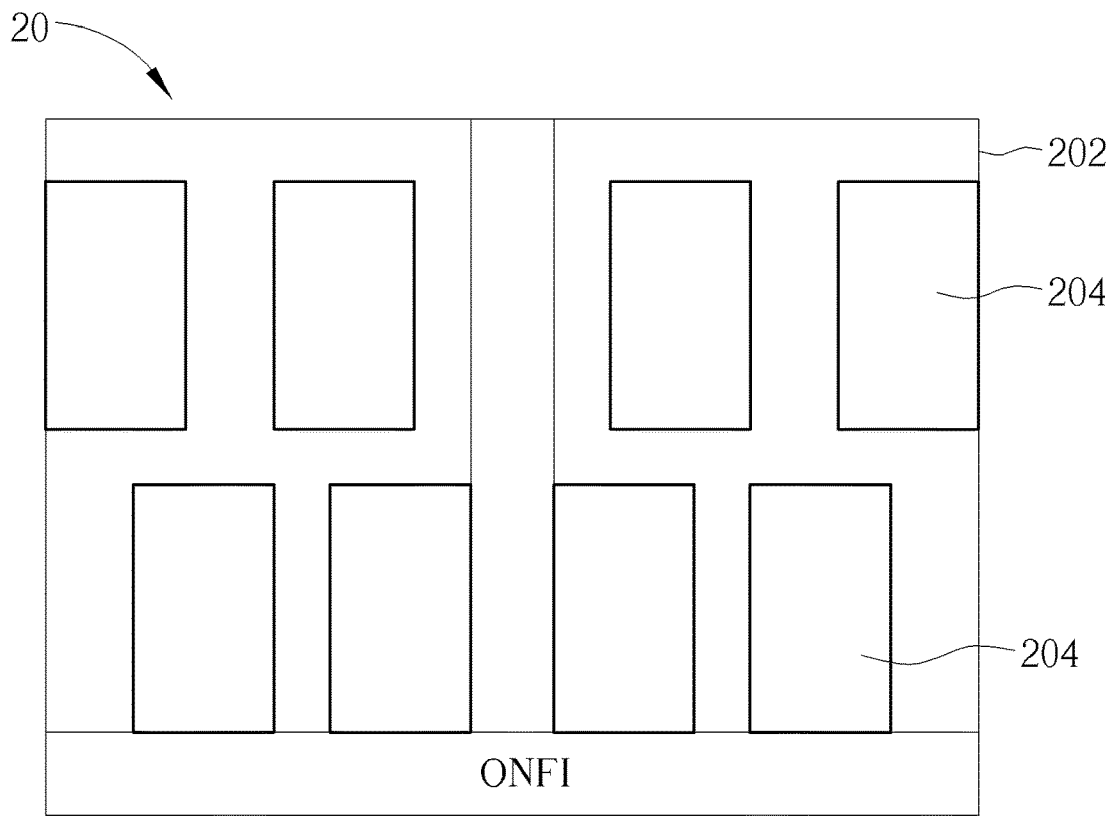
FIGS. 2-3 are schematic diagrams of 3D NAND flash memory device applying the integration process according to an embodiment of the present invention.
Figure 3:
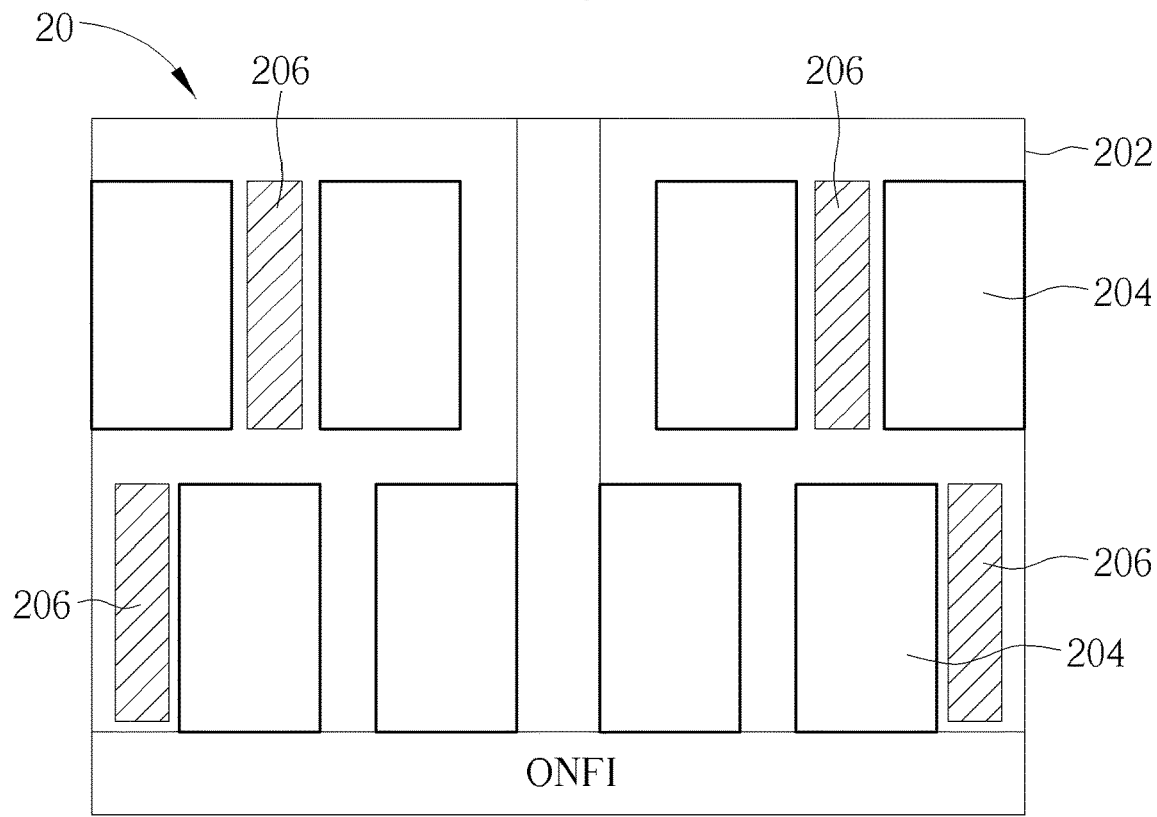

To explain the integration process 10, please also refer to FIGS. 2 and 3, which are schematic diagrams of 3D NAND flash memory device 20 applying the integration process 10 according to an embodiment of the present invention. As shown in FIG. 2, the 3D NAND flash memory device 20 includes a CMOS die 202 embedded with a plurality of 3D TLC NAND flash memories 204.

According to the integration process 10, in step 104, the 3D TLC NAND flash memories 204 are disposed on the CMOS die 202, each of the 3D TLC NAND flash memories 204 is not overlapped with each other, such that gaps between each of the 3D TLC NAND flash memories 204 are formed on the CMOS die 202.

In step 106, the at least a NOR Flash memory is disposed on the CMOS die 202 of the 3D NAND flash memory device 20, wherein the at least a NOR Flash memory is disposed on an unused area of the CMOS die 202, the unused area of the CMOS die 202 may be the gaps between each of the 3D TLC NAND flash memories 204, redundant or spare area of the CMOS die 202. As such, as shown in FIG. 3, multiple NOR Flash memories 206 are disposed in the unused area of the CMOS die 202, such that a storage space of the 3D NAND flash memory device 20 is increased with the disposition of the NOR Flash memory 206 and a flexibility of the 3D NAND flash memory device 20 is improved. Notably, an amount of the NOR Flash memory 206 is not limited to four as illustrated in FIGS. 2 and 3, and other amounts, a density of deployment of NOR Flash memory may be disposed in the unused area of the CMOS die 202 according to different requirements.

In step 108, the NOR Flash memories 206 are connected to the ONFI of the 3D NAND flash memory device 20, wherein ONFI is an interface for standardizing pin assignments and commands for the 3D NAND flash memory device 20, which connects the 3D TLC NAND flash memories 204. In step 110, the datapath logic between the NOR Flash memories 206 and the ONFI are connected. The NOR Flash memories 206 may be indicated to read/write data according to the pin assignments and the commands of the ONFI after the datapath logic of the NOR Flash memories 206 are connected to the ONFI in step 108. That is, the NOR Flash memories 206 may share the ONFI with the 3D TLC NAND flash memories 204 to read/write the data via the ONFI or to directly read/write the data via the ONFI.

Since the NOR Flash memories 206 support random read and random write, the performance of the read time of the 3D NAND flash memory device 20 and the performance of the write time are improved when writing multiple small data. In addition, a controller of the 3D NAND flash memory device 20 is utilized for performing error control coding process for the data stored in the 3D TLC NAND flash memories 204. However, the data processed by the NOR Flash memories 206 are free from the error control coding, which reduces a complexity of the controller of the 3D NAND flash memory device 20 and improves the performance of the 3D NAND flash memory device 20.

The 3D NAND flash memory device 20 of the present invention with the disposition of the NOR Flash memories 206 may be applied in conventional solid-state disk (SSD) products to improve the read/write performance. Further, with the NOR Flash memories 206 disposed in the unused area of the CMOS die 202, manufacturing cost of the 3D NAND flash memory device 20 is maintained.

As shown in FIG. 3, the 3D NAND flash memory device 20 integrated on the CMOS die 202 of the present invention applying the integration method 10 includes the 3D TLC NAND flash memories 204 and the NOR Flash memories 206. The 3D TLC NAND flash memories 204 are disposed on the CMOS die 202 and the NOR Flash memories 206 are the disposed on the unused area of the CMOS die. In addition, since the datapath logic of NOR Flash memories 206 are connected to the ONFI, which standardizes the pin assignments and the commands for the 3D NAND flash memory device 20, the complexity of the 3D NAND flash memory device 20 is reduced and the read/write performance are increased without increasing the manufacturing cost of the 3D NAND flash memory device 20.

Notably, the embodiments stated above illustrate the concept of the present invention, those skilled in the art may make proper modifications accordingly, and not limited thereto.

In summary, the present invention provides a 3D NAND flash memory device and integration method thereof of, which improves storage space, read/write performance without increasing a manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integration method for a 3D NAND flash memory device, comprising:
    disposing a plurality of 3D triple-level cell (TLC) NAND flash memories on a CMOS die;
    disposing at least a NOR Flash memory on the CMOS die of the 3D NAND flash memory device; and
    connecting the at least a NOR Flash memory to an Open NAND Flash Interface (ONFI) of the 3D NAND flash memory device;
    wherein the at least a NOR Flash memory is disposed on an unused area of the CMOS die.

2. The integration method of claim 1, further comprising:
    connecting datapath logic between the at least a NOR Flash memory and the ONFI of the 3D NAND flash memory device.

3. The integration method of claim 1, wherein the at least a NOR Flash memory reads and writes data via the ONFI.

4. The integration method of claim 1, wherein the at least a NOR Flash memory is configured to perform random read and random write.

5. The integration method of claim 1, wherein the at least a NOR Flash memory is free from error control coding.

6. The integration method of claim 1, wherein the at least a NOR Flash memory shares the ONFI with the 3D triple-level cell (TLC) NAND flash memories.

7. The integration method of claim 1, wherein the unused area of the CMOS die is composed of a plurality of gaps between each of the plurality of 3D triple-level cell (TLC) NAND flash memories.

8. A 3D NAND flash memory device, integrated on a CMOS die, comprising:
    a plurality of 3D triple-level cell (TLC) NAND flash memories, disposed on the CMOS die; and
    at least a NOR Flash memory, disposed on the CMOS die and the at least a NOR Flash memory is connected to an Open NAND Flash Interface (ONFI) of the 3D NAND flash memory;
    wherein the at least a NOR Flash memory is disposed on an unused area of the CMOS die.

9. The 3D NAND flash memory device of claim 8, wherein datapath logic between the at least a NOR Flash memory and the ONFI of the 3D NAND flash is connected.

10. The 3D NAND flash memory device of claim 8, wherein the at least a NOR Flash memory reads and writes data via the ONFI.

11. The 3D NAND flash memory device of claim 8, wherein the at least a NOR Flash memory is configured to perform random read and random write.

12. The 3D NAND flash memory device of claim 8, wherein the at least a NOR Flash memory is free from error control coding.

13. The 3D NAND flash memory device of claim 8, wherein the at least a NOR Flash memory shares the ONFI with the 3D triple-level cell (TLC) NAND flash memories.

14. The 3D NAND flash memory device of claim 8, wherein the unused area of the CMOS die is composed of a plurality of gaps between each of the plurality of 3D triple-level cell (TLC) NAND flash memories.

* * * * *